United States Patent
Jankowski et al.

(10) Patent No.: US 12,021,542 B2
(45) Date of Patent: Jun. 25, 2024

(54) DEVICE, SYSTEM, AND METHOD FOR INTRA-PACKAGE ELECTROMAGNETIC INTERFERENCE SUPPRESSION

(71) Applicant: TEXAS INSTRUMENTS INCORPORATED, Dallas, TX (US)

(72) Inventors: Maciej Jankowski, Freising (DE); Ruediger Kuhn, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 17/685,676

(22) Filed: Mar. 3, 2022

(65) Prior Publication Data
US 2023/0283287 A1 Sep. 7, 2023

(51) Int. Cl.
| | |
|---|---|
| H03M 1/06 | (2006.01) |
| H03L 7/099 | (2006.01) |
| H03L 7/18 | (2006.01) |
| H03L 7/23 | (2006.01) |
| H03M 1/08 | (2006.01) |
| H03M 1/12 | (2006.01) |

(52) U.S. Cl.
CPC ........ *H03M 1/0626* (2013.01); *H03L 7/0992* (2013.01); *H03L 7/18* (2013.01); *H03L 7/23* (2013.01); *H03M 1/127* (2013.01); *H03M 1/0845* (2013.01)

(58) Field of Classification Search
CPC ... H03M 1/127; H03M 1/0626; H03M 1/0845
See application file for complete search history.

(56) References Cited

U.S. PATENT DOCUMENTS

| | | | |
|---|---|---|---|
| 8,928,401 B2* | 1/2015 | Verlinden | H03F 3/211 330/124 R |
| 9,948,318 B1* | 4/2018 | Tsai | H03M 3/458 |
| 10,218,374 B2 | 2/2019 | Snoeij et al. | |
| 10,574,252 B2 | 2/2020 | Snoeij et al. | |
| 11,005,489 B2 | 5/2021 | Snoeij et al. | |

(Continued)

OTHER PUBLICATIONS

Analog Devices. "3-Channel, Isolated, Sigma-Delta ADC with SPI" Published in 2018.

(Continued)

*Primary Examiner* — Lam T Mai
(74) *Attorney, Agent, or Firm* — John R. Pessetto; Frank D. Cimino

(57) ABSTRACT

A device includes a voltage converter and an analog to digital converter (ADC). The voltage converter includes an input to receive a first voltage and an output to output a second voltage based on a switching signal having a first discrete converter frequency and a second discrete converter frequency. The ADC is coupled to and proximate to the voltage converter. The ADC includes a digital filter configured to substantially attenuate a first filter frequency and a second filter frequency. The voltage converter further includes a frequency control device configured to set the first discrete converter frequency and the second discrete converter frequency so that the first discrete converter frequency is approximately equal to the first filter frequency and the second discrete converter frequency is approximately equal to the second filter frequency.

20 Claims, 7 Drawing Sheets

(56) References Cited

U.S. PATENT DOCUMENTS

| | | | | |
|---|---|---|---|---|
| 2006/0220750 A1* | 10/2006 | Akamine | ............ | H03C 3/0966 |
| | | | | 331/16 |
| 2009/0027247 A1* | 1/2009 | Kumamoto | ........... | H03M 3/376 |
| | | | | 341/143 |
| 2010/0085090 A1* | 4/2010 | Lin | ........................... | H03L 7/22 |
| | | | | 327/156 |
| 2010/0117881 A1* | 5/2010 | Baker | ..................... | H03M 3/47 |
| | | | | 341/143 |
| 2011/0187339 A1* | 8/2011 | Trattler | ................ | H05B 45/375 |
| | | | | 323/283 |
| 2014/0145787 A1* | 5/2014 | Verlinden | ............. | H03M 1/662 |
| | | | | 330/124 R |
| 2015/0055737 A1* | 2/2015 | Bourdi | .................. | H03L 7/1976 |
| | | | | 327/156 |
| 2017/0093279 A1* | 3/2017 | Hezar | ................... | H02M 3/156 |
| 2021/0046320 A1* | 2/2021 | Tan | ........................ | H03G 3/002 |
| 2021/0052905 A1* | 2/2021 | Tan | ........................ | H03G 3/002 |
| 2021/0376731 A1* | 12/2021 | Bayer | ...................... | H03K 5/24 |
| 2023/0155500 A1* | 5/2023 | Baldwin, Jr. | ........... | H02M 1/08 |
| | | | | 323/283 |

OTHER PUBLICATIONS

Tan et al. "A Fully Isolated Delta-Sigma ADC for Shunt Based Current Sensing" IEEE Journal of Solid-State Circuits, vol. 51, No. 10, Oct. 2016.

Texas Instruments. "AMC3306 and AMC3336 Evaluation Module" Published Mar. 2021.

* cited by examiner

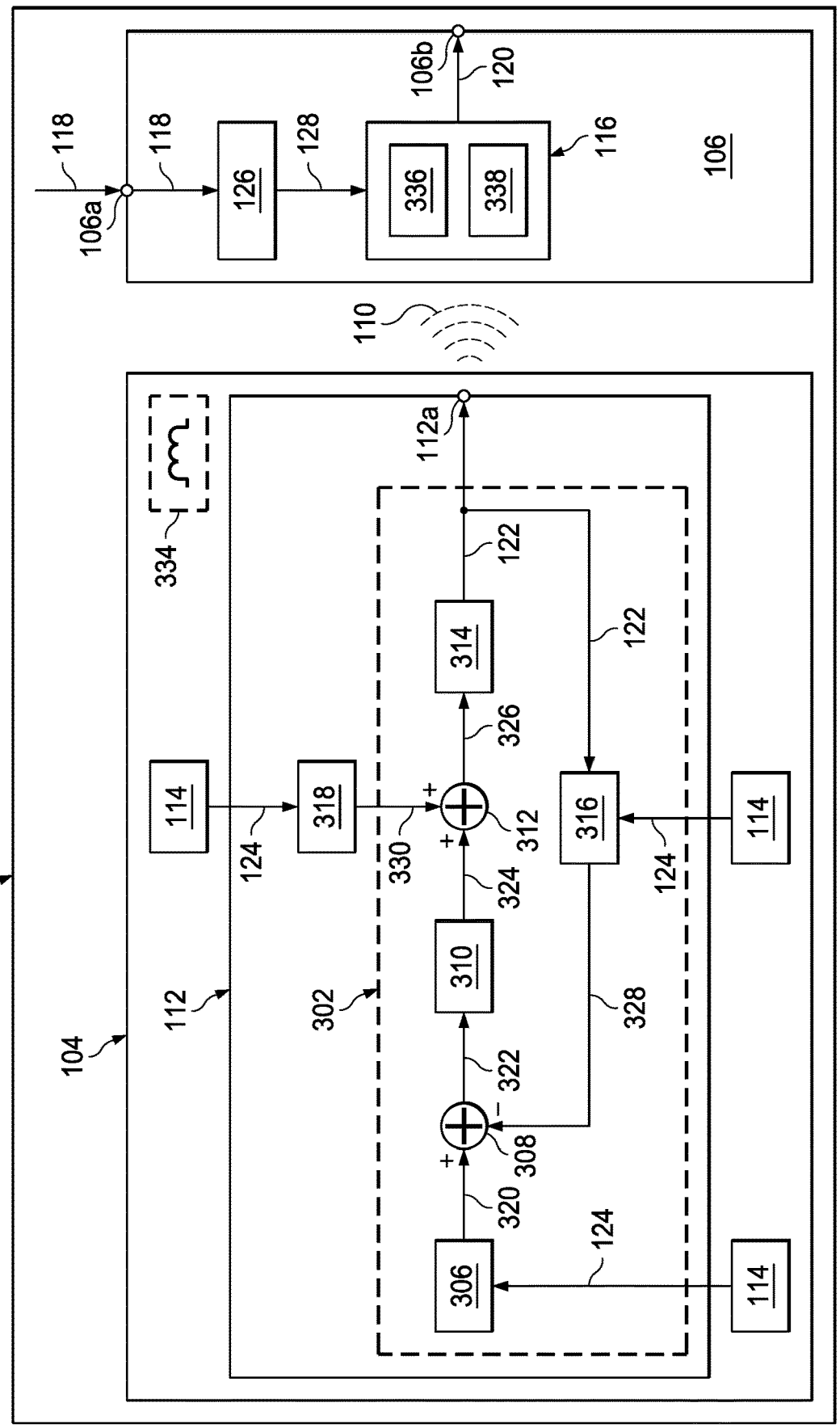

DEVICE, SYSTEM, AND METHOD FOR INTRA-PACKAGE ELECTROMAGNETIC INTERFERENCE SUPPRESSION

BACKGROUND

Power converters (e.g., direct current (DC)-to-DC converters, alternating current (AC)-to-AC converters, or the like) and analog-to-digital converters (ADCs), among other components, are widely used in modern electronics. Oftentimes, modern devices include both a power converter and an ADC within a single device package. Generally, power converters receive an input voltage and provide an output voltage different from the input voltage. Generally, ADCs receive an analog signal and provide a digital signal based (e.g., a binary signal) on sampling the analog signal over time. In some devices, a power converter may interfere with an operation of an ADC, or vice versa.

SUMMARY

In one example, a device includes a voltage converter. The voltage converter includes an input to receive a first voltage and an output to output a second voltage based on a switching signal having a first discrete converter frequency and a second discrete converter frequency. The second discrete converter frequency is different than the first discrete converter frequency by a first frequency interval. The voltage converter further includes a frequency control device. The device further includes an analog to digital converter (ADC) coupled to and proximate to the voltage converter. The ADC includes a modulator and a digital filter. The modulator is configured to modulate an analog signal received at an ADC input responsive to an ADC sampling frequency and provide a modulated signal to the digital filter. The digital filter is configured to filter the modulated signal according to a pass band and a stop band and provide a digital signal at an ADC output. The digital filter is configured to substantially attenuate a first filter frequency and a second filter frequency. The second filter frequency is different than the first filter frequency by a second frequency interval. The frequency control device is configured to set the first discrete converter frequency and the second discrete converter frequency so that the first discrete converter frequency is approximately equal to the first filter frequency and the second discrete converter frequency is approximately equal to the second filter frequency.

In one example, a system includes a direct current to direct current (DC-to-DC) converter and an analog to digital converter (ADC). The DC-to-DC converter includes an input, an output, and a frequency control device. The input is to receive a first direct current (DC) voltage. The output is to output a second DC voltage based on a switching signal having a plurality of discrete converter frequencies that are different from one another by a first frequency interval. The ADC is coupled to and proximate to the DC-to-DC converter. The ADC includes a modulator and a digital filter. The modulator is configured to convert an analog signal to a modulated signal based on an ADC sampling frequency. The digital filter is configured to convert the modulated signal to a digital signal according to a pass band and a stop band. The digital filter has a plurality of notches in the stop band corresponding to a plurality of filter frequencies that are substantially attenuated by the digital filter. The filter frequencies are based on the ADC sampling frequency and an oversampling ratio of the ADC. The frequency control device is configured to set a first discrete converter frequency of the plurality of discrete converter frequencies and the first frequency interval based on the ADC sampling frequency and the oversampling ratio of the ADC so that each of the plurality of discrete converter frequencies are approximately equal to filter frequencies of the plurality of filter frequencies.

In one example, a method includes receiving a first direct current (DC) voltage at an input of a direct current to direct current (DC-to-DC) converter. A second DC voltage is provided at an output of the DC-to-DC converter based on a switching signal having a plurality of discrete converter frequencies that are different from one another by a first frequency difference. An analog signal is received at an input of an analog-to-digital converter (ADC). A digital signal is provided at an output of the ADC representative of the analog signal and based on an ADC sampling frequency and digital filtering. The digital signal is provided at the output of the ADC based on a pass band and a stop band of the digital filtering. The digital filtering substantially attenuates a plurality of discrete filter frequencies in the stop band that differ by a second frequency difference. A first discrete converter frequency and a second discrete converter frequency of the plurality of discrete converter frequencies are set for the DC-to-DC converter so that the first discrete converter frequency and the second discrete converter frequency respectively correspond to a first discrete filter frequency and a second discrete filter frequency of the plurality of discrete filter frequencies.

BRIEF DESCRIPTION OF THE DRAWINGS

FIG. 3 is an example block diagram of the device of FIG. 1 in which the frequency control device includes a phase-locked loop.

The same reference numbers or other reference designators are used in the drawings to designate the same or similar (functionally and/or structurally) features.

DETAILED DESCRIPTION

Many modern devices (e.g., devices used in personal electronics, automotive applications, industrial applications, and other battery-powered applications) include a direct current to direct current (DC-to-DC) converter and an analog-to-digital converter (ADC) within a single device package. In some devices where the DC-to-DC converter is proximate (e.g., physically close on/in a semiconductor substrate) to the ADC within the device package, the DC-to-DC converter may be unintentionally electromagnetically coupled to the ADC. Thus, the DC-to-DC converter may interfere with the ADC by way of electromagnetic interference (EMI). As a result, a performance (e.g., an input DC offset voltage, a thermal drift of DC offset voltage, a total harmonic distortion, a power supply rejection ratio, a signal to noise ratio, a spurious-free dynamic range, or the like) of the ADC may be disturbed and/or altered.

Accordingly, various examples of the present description are related to a device including a DC-to-DC converter comprising a frequency control device configured to control a frequency of the DC-to-DC converter based on an ADC that is proximate to the DC-to-DC converter in order to reduce an interference between the DC-to-DC converter and the ADC. By configuring the frequency control device to control a frequency of the DC-to-DC converter based on the ADC (and, in some examples, a filter included in the ADC), the ADC can better withstand EMI signal(s) emitted by the DC-to-DC converter that interfere with the ADC.

Figure 1:
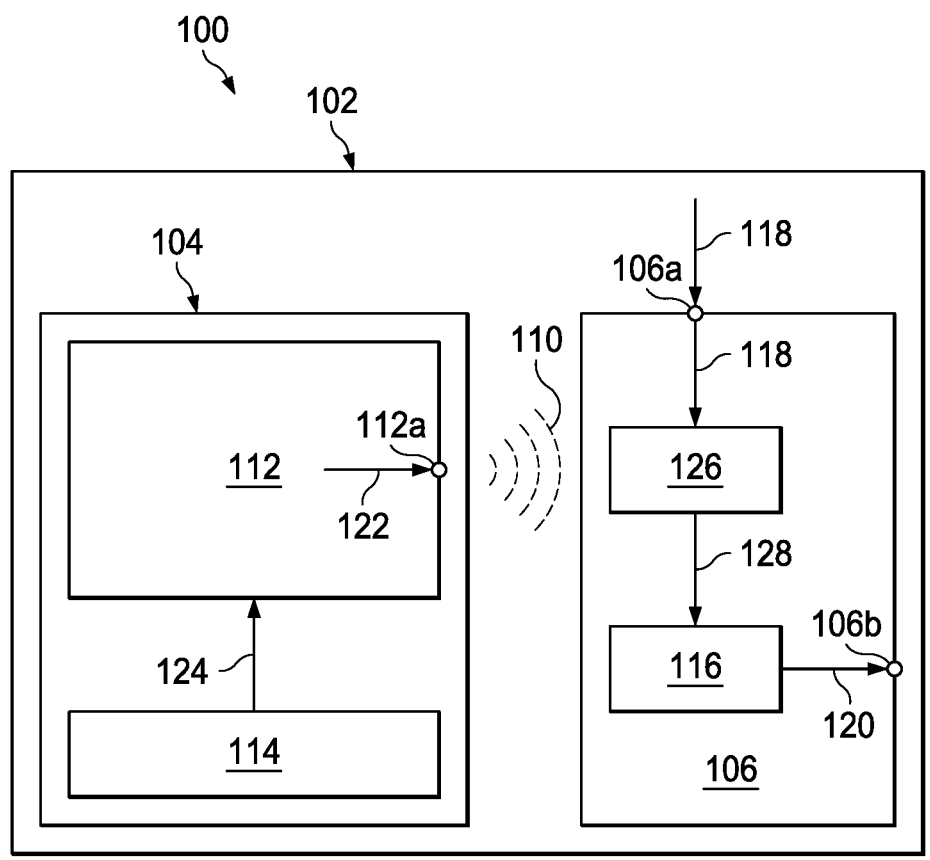
FIG. 1 is an example block diagram of a device including an ADC proximate to a DC-to-DC converter, the DC-to-DC converter including a frequency control device configured to reduce an electromagnetic interference between the DC-to-DC converter and the ADC.

FIG. 1 is an example block diagram 100 of a device 102 (e.g., analog and/or digital circuitry implemented on/in a semiconductor substrate or different semiconductor substrates within the same device package) including an ADC 106 proximate to a DC-to-DC converter 104, the DC-to-DC converter 104 including a frequency control device 112 configured to reduce an electromagnetic interference between the DC-to-DC converter 104 and the ADC 106.

In some examples, DC-to-DC converter 104 (which may also be referred to as a DC-to-DC regulator) may include one or more switches (e.g., implemented using transistors, such as metal-oxide-silicon field effect transistors) and one or more energy storage devices (e.g., an inductor and/or a capacitor). To regulate the output voltage of the DC-to-DC converter 104, the switch(es) may be turned on/off using a modulated signal (e.g., modulated using pulse width modulation, PWM, pulse frequency modulation, PFM, or some other modulation technique) applied to the control terminal (e.g., the gate) of the switch(es). This modulated signal may be implemented by a switching signal 122. Converter 104 may be used to isolate a power supply (such as a battery, DC power supply or an AC power supply) from the circuitry/circuitries that converter 104 supplies voltage/power to (such as ADC 106).

FIGS. 2A, 2B, 2C and 2D (collectively and individually referred to as FIG. 2) include example graphs 200a, 200b, 200c, and 200d (collectively and individually referred to as graph 200), respectively, of a filter response 206 of a filter 116 of the ADC 106 of FIG. 1, a spectrum of an analog signal 118 of the ADC 106 of FIG. 1, and a spectrum of a switching signal 122 of the DC-to-DC converter 104 of FIG. 1. The filter response 206, the analog signal 118, and the switching signal 122 are illustrated in the frequency domain in the graph of FIGS. 2A-2D.

Figure 2A:
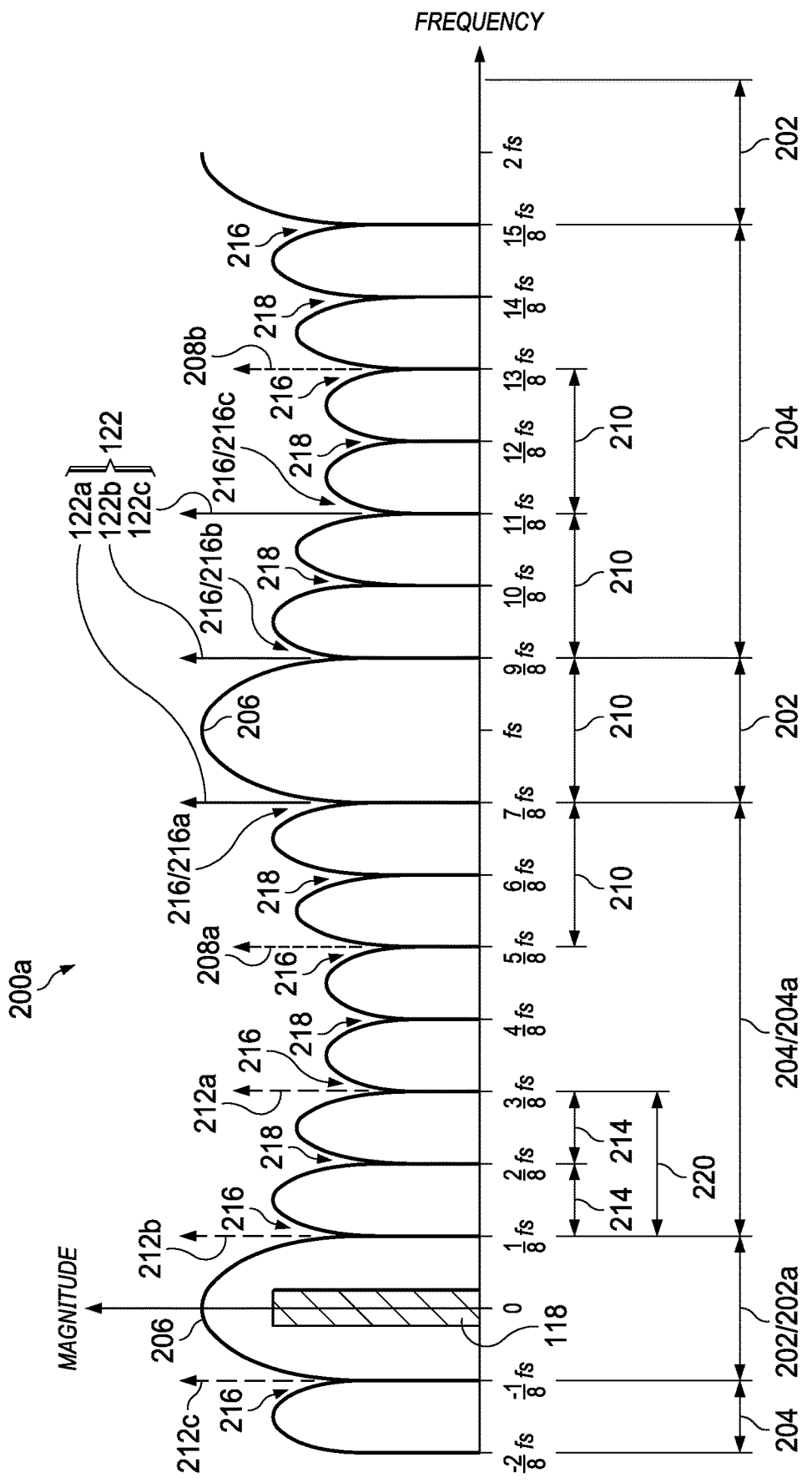
FIGS. 2A, 2B, 2C, and 2D are example graphs of a filter response of a filter of the ADC of FIG. 1, an analog signal of the ADC of FIG. 1, and a switching signal of the DC-to-DC converter of FIG. 1.

Referring to FIGS. 1 and 2A, the DC-to-DC converter 104 is configured to convert an input signal (e.g., received at an input of the DC-to-DC converter 104) from a first DC voltage to a second DC voltage (or, in some examples, to regulate the input DC voltage so that the output DC voltage is the same voltage as the input voltage but more stable) based on a switching signal 122. The DC-to-DC converter 104 has an output to output the second DC voltage. The switching signal 122 has a plurality of discrete converter frequency components that are spaced apart according to a first frequency interval 210. For example, the DC-to-DC converter 104 is configured to covert a first DC voltage to a second DC voltage, different form the first DC voltage, based on a switching signal 122 having a first discrete converter frequency component 122a (e.g., at $7/8*f_s$, where $f_s$ is the sampling frequency of the ADC 106), a second discrete converter frequency component 122b (e.g., at $9/8*f_s$), and a third discrete converter frequency component 122c (e.g., at $11/8*f_s$) that are spaced apart according to the first frequency interval 210 (e.g., a $2/8*f_s$ interval). In some examples where the DC-to-DC converter 104 operates using spread-spectrum clocking (SSC), the first frequency interval 210 may be referred to as a spread-spectrum clocking frequency $f_{SSC}$. In some examples, the second discrete converter frequency component 122b is referred to as the average discrete converter frequency component of the DC-to-DC converter 104.

The ADC 106 is proximate to the DC-to-DC converter 104. The ADC includes a modulator 126 (e.g., a $\Delta\Sigma$ modulator) and a filter 116 (e.g., a filter implemented using analog components (an analog filter) or a filter implemented using digital components and/or having tap weights (a digital filter)). The ADC 106 has an ADC input 106a and an ADC output 106b. The ADC 106 is configured to receive an analog signal 118 at the ADC input 106a and provide a digital signal 120 at the ADC output 106b based on the analog signal 118. For example, the modulator 126 receives the analog signal 118 from the ADC input 106a, modulates the received analog signal 118 according to an ADC sampling frequency $f_s$, and provides a modulated signal 128 to the filter 116. The filter 116 receives the modulated signal 128 from the modulator 126, filters the modulated signal 128, and provides the digital signal 120 to the ADC output 106b.

In some examples, an unintentional electromagnetic coupling may exist between the DC-to-DC converter 104 and the ADC 106. Thus, the DC-to-DC converter 104 may interfere with the ADC 106 by way of electromagnetic interference (EMI). For example, the switching signal 122 may be unintentionally emitted from the DC-to-DC converter 104 as an EMI signal 110 which may interfere with the analog signal 118 at the ADC input 106a. The EMI signal 110 emitted from the DC-to-DC converter 104 can have frequency components corresponding to the discrete converter frequencies components (e.g., 122a, 122b, 122c) of the switching signal 122. Thus, the discrete converter frequency components (e.g., 122a, 122b, 122c) may interfere with the analog signal 118 at the ADC input 106a by way of the EMI signal 110. As a result, the analog signal 118 may have interference components corresponding to the discrete converter frequency components.

In some devices, the spectral range of the DC-to-DC converter 104 may extend beyond the plurality of discrete converter frequency components (e.g., 122a, 122b, 122c). These components (e.g., 208a, 208b) that extend beyond the discrete converter frequency components of the DC-to-DC converter 104 may exist at additional discrete frequencies (e.g., spurious frequencies) and may be referred to as spurious signals, spurious signal components, spurious components, or the like. In some instances, the spurious signals (e.g., 208a, 208b) are spaced apart from the discrete converter frequency components (e.g., 122a, 122b, 122c) by integer multiples of the first frequency interval 210 (e.g., $f_{SSC}$) In the example illustrated in FIG. 2A, a first spurious signal 208a exists at a first spurious frequency (e.g., $5/8*f_s$) that is spaced apart from the first discrete converter frequency component 122a by the first frequency interval 210. Similarly, a second spurious signal 208b exists at a second spurious frequency (e.g., $13/8*f_s$) that is spaced apart from the third discrete converter frequency component 122c by the first frequency interval 210. Although only two spurious signals are illustrated in FIG. 2, it will be appreciated that other spurious signals may also exist at additional frequencies (e.g., at $3/8*f_s$, at $15/8*f_s$, etc.).

In some examples, these spurious signals (e.g., 208a, 208b) may interfere with the analog signal 118 by way of the EMI signal 110 emitted from the DC-to-DC converter 104.

As a result, the analog signal 118 may have interference components corresponding to the spurious signals (e.g., 208a, 208b) at their respective spurious frequencies (e.g., $5/8*f_s$ and $13/8*f_s$).

Further, in some examples, the discrete converter frequency components (e.g., 122a, 122b, 122c) and the spurious signals (e.g., 208a, 208b) interfering with the analog signal 118 may alias to other frequencies (e.g., aliased frequencies) when the analog signal 118 is modulated (e.g., sampled) at the ADC 106. As a result, the modulated signal 128 may have interference components at aliased frequencies as well as at the discrete converter frequencies and/or the spurious frequencies. For example, the first spurious signal 208a may alias to a first aliased frequency (e.g., $3/8*f_s$) thereby forming a first aliased signal 212a at the first aliased frequency; the first discrete converter frequency component 122a may alias to a second aliased frequency (e.g., $1/8*f_s$) thereby forming a second aliased signal 212b at the second aliased frequency; the second discrete converter frequency component 122b may alias to a third aliased frequency (e.g., $-1/8*f_s$) thereby forming a third aliased signal 212c at the third aliased frequency; and the third discrete converter frequency component 122c may alias to a fourth aliased frequency (e.g., $-3/8*f_s$, which is not shown) thereby forming a fourth aliased signal (not shown) at the fourth aliased frequency. Other aliased signals (e.g., a fifth aliased signal, a sixth aliased signal, etc.) may also exist at other aliased frequencies.

The filter 116 is configured to provide the digital signal 120 at the ADC output 106b according to a pass band 202 and a stop band 204. In some examples, the frequency response 206 of the filter 116 is symmetric and repeating about integer multiples of the ADC sampling frequency $f_s$, as shown in FIG. 2A. Thus, the pass band 202 and the stop band 204 repeat about integer multiples of the ADC sampling frequency $f_s$, as shown in FIG. 2A. The filter 116 is configured to attenuate (e.g., reduce in magnitude by a factor of 0.707 (−3 decibels) or more) signal components having frequencies in the stop band 204. Further, in some examples, the filter 116 is configured to substantially attenuate (e.g., reduce in magnitude by a factor of 0.10 (−20 decibels) or more) signal components corresponding to a plurality of filter frequencies (e.g., $-1/8*f_s$, $1/8*f_s$, $2/8*f_s$, $3/8*f_s$, etc.) that are in the stop band 204. Filter frequencies in a given section of the stop band 204 (e.g., a first stop band section 204a) are spaced apart according to a second frequency interval 214. Further, neighboring filter frequencies (e.g., $-1/8*f_s$ and $1/8*f_s$) that are separated by a given section of the pass band 202 (e.g., a first pass band section 202a) are spaced apart by twice the second frequency interval 214. In some examples, the first frequency interval 210 is equal to an integer multiple of the third frequency interval 220.

Notches of a filter are sections along the frequency response of the filter where substantial attenuation occurs (e.g., where the filter gain drops to zero or near zero). The filter frequencies (e.g., $-1/8*f_s$, $1/8*f_s$, $2/8*f_s$, $3/8*f_s$, etc.) correspond to notches (e.g., 216, 218) of the filter 116. In other words, the notches (e.g., 216, 218) exist at the filter frequencies. The filter 116 has odd notches 216 and even notches 218. An odd notch 216 is a notch of the filter 116 that is odd numbered when counting the notches of the filter 116 outwardly from a given section of the pass band 202 (e.g., the first pass band section 202a) and an even notch 218 is a notch of the filter 116 that is even numbered when counting the notches of the filter 116 outwardly from a given section of the pass band 202. For example, in the filter response 206 illustrated in FIG. 2A, a first notch from the first pass band section 202a is at $1/8*f_s$ (and also at $-1/8*f_s$), a second notch from the first pass band section 202a is at $2/8*f_s$ (and also at $-2/8*f_s$), and so on. The first notch (at $1/8*f_s$) from the first pass band section 202a is an odd notch 216, the second notch (at $2/8*f_s$) from the first pass band section 202a is an even notch 218, and so on. In the example illustrated in FIG. 2A, the illustrated odd notches 216 are at $-1/8*f_s$, $1/8*f_s$, $3/8*f_s$, $5/8*f_s$, $7/8*f_s$, $9/8*f_s$, $11/8*f_s$, $13/8*f_s$, and $15/8*f_s$, and the illustrated even notches 218 are at $-2/8*f_s$, $2/8*f_s$, $4/8*f_s$, $6/8*f_s$, $10/8*f_s$, $12/8*f_s$, and $14/8*f_s$. The odd notches 216 are spaced apart from one another at a third frequency interval 220. The third frequency interval 220 is twice the second frequency interval 214. In some examples, the third frequency interval 220 is equal to the first frequency interval 210. In other words, in some examples, the odd notches 216 are spaced at the first frequency interval 210.

The frequency control device 112 is configured to set the discrete converter frequencies components (e.g., 122a, 122b, 122c) of the switching signal 122 for the DC-to-DC converter 104. The frequency control device 112 is configured to provide the switching signal 122 having the discrete converter frequency components to the DC-to-DC converter 104 at a frequency control device output 112a. In addition, the frequency control device 112 is configured to receive filter information 124 about the filter 116 from a filter information input 114 of the DC-to-DC converter 104. The filter information 124 can include information about the pass band 202 of the filter 116, the stop band 204 of the filter 116, the filter frequencies that are attenuated by the filter 116 (e.g., the frequencies corresponding to the notches of the filter 116), or the like.

Figure 2B:
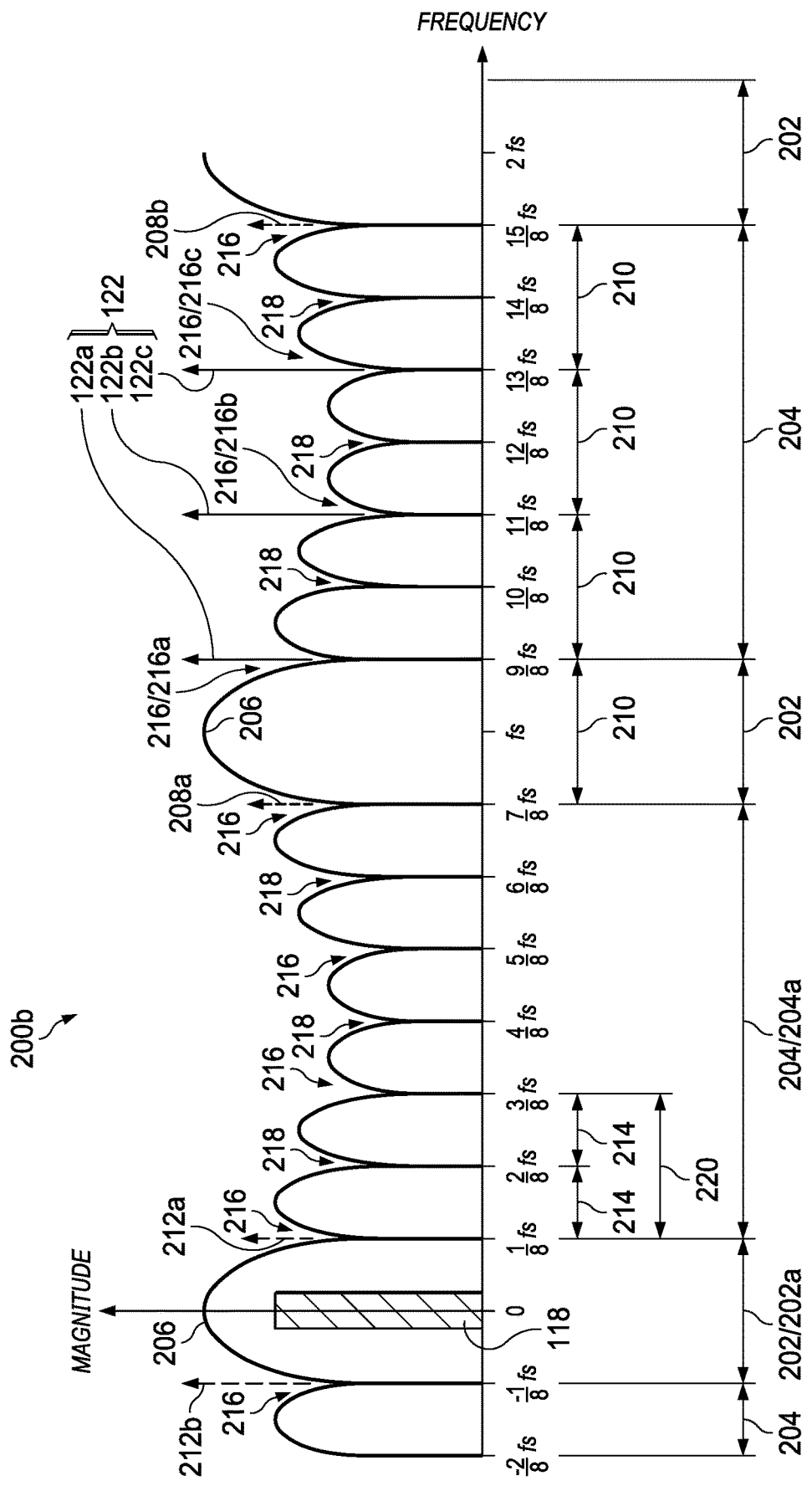
Figure 2C:
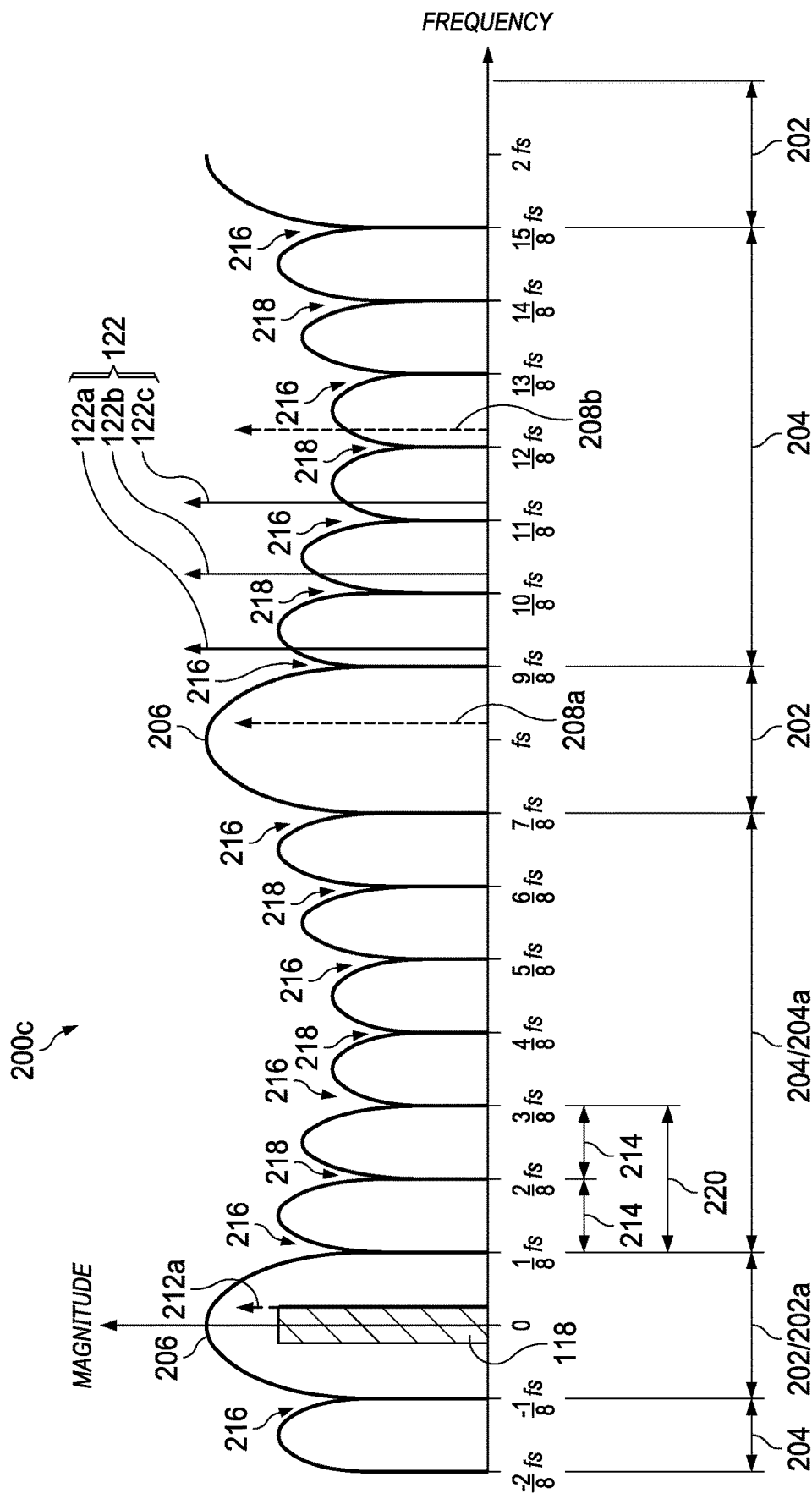
Figure 2D:
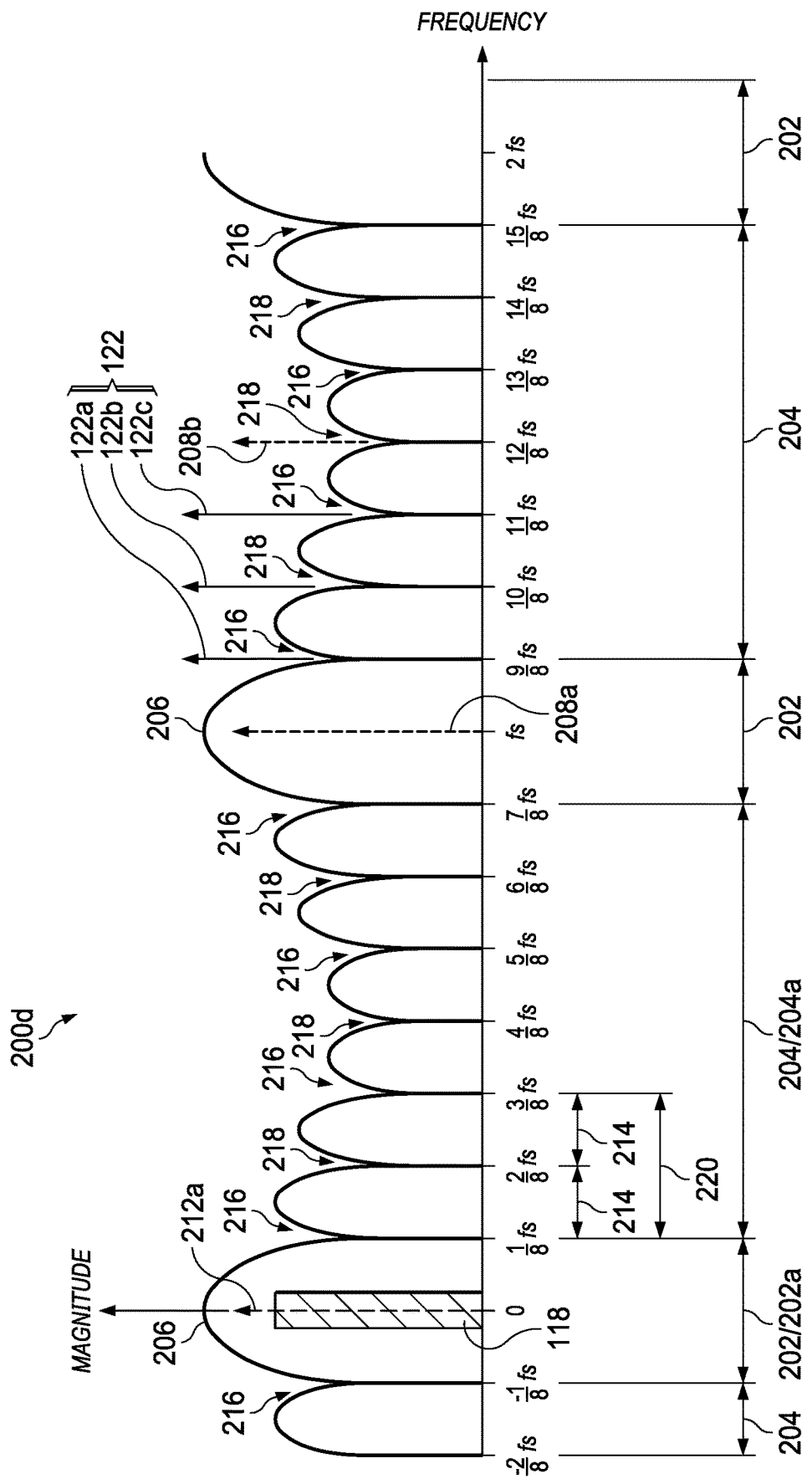

In some devices, the discrete converter frequency components (e.g., 122a, 122b, 122c) are set to frequencies that are within the stop band 204 of the filter 116 (e.g., as illustrated in FIGS. 2C and 2D). However, in some devices, the spurious signals (e.g., 208a, 208b of FIG. 2C) may fall within the pass band 202 and further may alias (e.g., 212a of FIG. 2C) to a non-zero baseband frequency (e.g., a non-zero frequency that is in a low frequency section of the pass band of the filter 116), as illustrated in FIG. 2C, when the analog signal 118 is modulated at the ADC 106. As a result, a signal to noise ratio (SNR) of the ADC 106, a spurious-free dynamic range (SFDR) of the ADC 106, or the like may be disturbed. Further, in some devices, the spurious signals (e.g., 208a, 208b of FIG. 2D) may fall within the pass band 202 and further may alias (e.g., 212a of FIG. 2D) to zero frequency (e.g., DC), as illustrated in FIG. 2D, when the analog signal 118 is modulated at the ADC 106. As a result, a DC offset voltage of the ADC 106, a thermal drift of DC offset voltage of the ADC 106, a total harmonic distortion (THD) of the ADC 106, a power supply rejection ratio (PSRR) of the ADC 106, or the like may be disturbed.

Accordingly, in various examples of the present disclosure, the frequency control device 112 is configured to set the discrete converter frequencies components (e.g., 122a, 122b, 122c) based on the filter information 124 so that the discrete converter frequency components of the switching signal 122 are suppressed by the filter 116 (e.g., as illustrated in FIGS. 2A and 2B). In particular, the frequency control device 112 of the DC-to-DC converter 104 is configured to set the plurality of discrete converter frequencies based on the ADC sampling frequency $f_s$ and the filter information 124 so that the plurality of discrete converter frequency components (e.g., 122a, 122b, 122c) correspond to odd notches 216 of the filter 116 and do not correspond to integer multiples of the ADC sampling frequency $f_s$.

For example, as illustrated in FIG. 2A, the frequency control device 112 of the DC-to-DC converter 104 is configured to set the first discrete converter frequency component 122a, the second discrete converter frequency component 122b, and the third discrete converter frequency component 122c of the switching signal 122 to correspond to a first odd notch 216a (e.g., corresponding to a filter frequency of $7/8*f_s$), a second odd notch 216b (e.g., corresponding to a second filter frequency of $9/8*f_s$), and a third odd notch 216c (e.g., corresponding to a third filter frequency of $11/8*f_s$), respectively.

By configuring the frequency control device 112 to set the discrete converter frequency components (e.g., 122a, 122b, 122c) to correspond to odd notches 216 of the filter 116, the spurious signals (e.g., 208a, 208b) will also correspond to odd notches 216 of the filter 116 because the spurious signals are spaced apart from the discrete converter frequency components according the first frequency interval 210 and the odd notches 216 are also spaced apart according to the first frequency interval 210. Thus, even if the spurious signals (e.g., 208a, 208b) interfere with the analog signal 118 received by the ADC 106, the interference corresponding to the spurious signals can be suppressed by the filter 116. As a result, a degradation of the performance (e.g., a DC offset voltage, a thermal drift of DC offset voltage, a THD, a PSRR, a SNR, a SFDR, or the like) of the ADC 106 by the spurious signals can be reduced.

Further, by configuring the frequency control device 112 to set the discrete converter frequency components (e.g., 122a, 122b, 122c) to correspond to odd notches 216 of the filter 116, the aliased signals (e.g., 212a, 212b, 212c) will also correspond to odd notches 216 of the filter 116. This is because the aliased signals will be symmetric with the discrete converter frequency components and/or the spurious signals about half of the ADC sampling frequency $f_s$ (i.e., $4/8*f_s$) and because the odd notches 216 in which the signals that are aliased (e.g., 122a, 122b, 208a, 208b) are positioned are also symmetric about half of the ADC sampling frequency $f_s$. Thus, even if the modulated signal 128 has aliased signal interference components, the aliased signals will have aliased to (i.e., will be positioned at) odd notches 216 and not to zero frequency (e.g., DC) nor to a frequency within the baseband. Thus, the interference corresponding to the aliased signals can be suppressed by the filter 116. As a result, a disturbance of the performance of the ADC 106 by the aliased signals can be reduced.

FIG. 2B is another example graph 200b of a filter response 206 of a filter 116 of the ADC 106 of FIG. 1, a spectrum of an analog signal 118 of the ADC 106 of FIG. 1, and a spectrum of a switching signal 122 of the DC-to-DC converter 104 of FIG. 1.

In the example illustrated in FIG. 2B, the discrete converter frequency components (e.g., 122a, 122b, 122c) are also set to frequencies (e.g., $9/8*f_s$, $11/8*f_s$, and $13/8*f_s$) corresponding to odd notches 216 of the filter 116. Thus, as previously discussed, the spurious signals (e.g., 208a, 208b) will also be positioned at frequencies (e.g., $7/8*f_s$ and $15/8*f_s$) corresponding to odd notches 216 of the filter 116. In turn, the aliased signals (e.g., 212a, 212b) will not exist at zero frequency (e.g., DC) or within the baseband. Instead, the aliased signals will be positioned at odd notches 216 of the filter 116. In the example illustrated in FIG. 2B, the aliased signals will be positioned at the odd notches which are at $-1/8*f_s$ and $1/8*f_s$. For example, the first spurious signal 208a may alias to a frequency (e.g., at $1/8*f_s$) corresponding to a first notch when the analog signal 118 having interference associated with the first spurious signal 208a is modulated. Further, the first discrete converter frequency component 122a may alias to a frequency (e.g., $-1/8*f_s$) corresponding to a second odd notch when the analog signal 118 having interference associated with the first discrete converter frequency component 122a is modulated.

Thus, even though the frequency control device 112 has set the discrete converter frequency components (e.g., 122a, 122b, 122c) at different frequencies corresponding to different odd notches in the example illustrated in FIG. 2B compared to the example illustrated in FIG. 2A (and thus the spurious signals 208a, 208b are also at different frequencies in FIG. 2B than those in FIG. 2A), the spurious signals and the aliased signals will still correspond to odd notches 216 of the filter 116. This is because the discrete converter frequency components are still set according to odd notches 216 of the filter 116 in the example illustrated in FIG. 2B. Thus, EMI signal(s) 110 can still be suppressed and a disturbance of the performance of the ADC 106 can still be reduced.

FIG. 2C is another example graph 200c of some other examples of a filter response 206 of a filter 116 of the ADC 106 of FIG. 1, a spectrum of an analog signal 118 of the ADC 106 of FIG. 1, and a spectrum of a switching signal 122 of the DC-to-DC converter 104 of FIG. 1.

In the example illustrated in FIG. 2C, the discrete converter frequency components (e.g., 122a, 122b, 122c) are set to arbitrary frequencies that are within the stop band 204 of the filter 116, but are not set according to odd notches 216 of the filter 116. Because the discrete converter frequency components are not set according to odd notches 216 of the filter 116, the spurious signals may be within the pass band 202 and further may alias to a frequency that is within the baseband. In particular, in the example illustrated in FIG. 2C, a spurious signal (e.g., 208a) aliases to a baseband frequency (e.g., a non-zero frequency in the first pass band section 202a) of the ADC 106, as shown by aliased signal 212a. Thus, if the analog signal 118 input to the ADC 106 experiences EMI from the DC-to-DC converter 104 (e.g., if the spurious signals interfere with the analog signal 118 before sampling and filtering), the spurious signals and their aliases may not be suppressed by the filter 116 when the modulated signal 128 is filtered. As a result, the performance of the ADC 106 may be disturbed.

FIG. 2D is another example graph 200d of a filter response 206 of a filter 116 of the ADC 106 of FIG. 1, a spectrum of an analog signal 118 of the ADC 106 of FIG. 1, and a spectrum of a switching signal 122 of the DC-to-DC converter 104 of FIG. 1.

In the example illustrated in FIG. 2D, the discrete converter frequencies (e.g., 122a, 122b, 122c) are set to frequencies corresponding to odd and even notches of the filter 116. Because not all of the discrete converter frequency components are set according to odd notches 216 of the filter 116, the spurious signals may be within the pass band 202 and further may alias to a frequency that is within the baseband (e.g., the first pass band section 202a). In particular, in the example illustrated in FIG. 2D, a spurious signal (e.g., 208a) may alias to zero frequency (i.e., DC), as shown by aliased signal 212a. Thus, if the analog signal 118 input to the ADC 106 experiences EMI from the DC-to-DC converter 104 (e.g., if the spurious signals interfere with the analog signal before sampling and filtering), the spurious signals and their aliases may not be suppressed by the filter 116 when the modulated signal 128 is filtered. As a result, the performance of the ADC 106 may be disturbed.

Thus, the frequency control device 112 of the device 102 of FIG. 1 is configured to set the discrete converter frequency components according to the odd notches 216 of the filter 116, as shown in FIG. 2A and FIG. 2B, to reduce a disturbance of the performance of the ADC by spurious signals and/or aliased signals.

In some other examples (not shown), the frequency control device 112 is configured to set the discrete converter frequency components to correspond to even notches 218 of the filter 116. For example, a first discrete converter frequency can be set to the even notch 218 at $6/8*f_s$, a second discrete converter frequency can be set to the even notch at $10/8*f_s$, and a third discrete converter frequency can be set to the even notch 218 at $14/8*f_s$. In the example, spurious signals components could exist, for example, at $2/8*f_s$ (which corresponds to an even notch), $18/8*f_s$ (which corresponds to an even notch), etc. In the example, the spurious signals components and the discrete converter frequency components could alias, for example, to $2/8*f_s$, $-2/8*f_s$, etc. Thus, in such example, the discrete converter frequencies components, the spurious signal components, and the corresponding aliased signal components would correspond to even notches 218 of the filter 116 and would not exist at zero frequency or some non-zero baseband frequency. Thus, a disturbance of the performance of the ADC by spurious signals and/or aliased signals may be similarly reduced in some such examples where the frequency control device 112 is configured to set the discrete converter frequency components to correspond to even notches 218 of the filter 116.

FIG. 3 is an example block diagram 300 of the device 102 of FIG. 1 in which the frequency control device 112 includes a phase-locked loop 302 and other circuitry.

In some examples, the phase-locked loop 302 includes a reference input 306, a subtractor 308, a loop filter 310, an adder 312, a voltage-controlled oscillator (VCO) 314, and a feedback divider 316. In some examples, the frequency control device 112 includes an SSC signal generator 318 coupled to the phase-locked loop 302. The reference input 306 is coupled to a first input of a subtractor 308. An output of the feedback divider 316 is coupled to a second input of the subtractor 308. An output of the subtractor 308 is coupled to an input of a loop filter 310. An output of the loop filter 310 is coupled to a first input of the adder 312. An output of the SSC signal generator 318 is coupled to a second input of the adder 312. An output of the adder 312 is coupled to an input of the VCO 314. An output of the VCO 314 is coupled to the frequency control device output 112a and an input of the feedback divider 316. Further, the filter information input 114 is coupled to the reference input 306, the feedback divider 316, and the SSC signal generator 318. Although component 302 is referred to as a phase-locked loop, in some other examples, component 302 may alternatively be or include a frequency-locked loop or some other suitable device.

In some examples, the filter information input 114 is implemented using some digital circuitry or some other circuitry, and may be referred to as filter information input circuitry. For example, the filter information input 114 may be or include a user register implemented by some digital circuitry, some internal circuitry, or the like. In some examples, the reference input 306 is implemented using some digital circuitry or some other circuitry, and may be referred to as reference input circuitry. For example, the reference input 306 may be or include a digital input cell (receiving a sampling clock signal associated with the ADC sampling rate or using an internal clock signal) followed by a digital frequency divider controlled by the filter information input 114. In some examples, the feedback divider 316 is implemented using some digital circuitry or some other circuitry, and may be referred to as feedback divider circuitry. For example, the feedback divider 316 may be or include a programmable frequency divider. In some examples, the SSC signal generator 318 is implemented using some digital circuitry or some other circuitry, and may be referred to as SSC signal generation circuitry. For example, the SSC signal generator 318 may be or include a digital-to-analog converter controlled by some digital circuitry that digitally generates an SSC signal 330.

The reference input 306 provides a reference signal 320 having a reference frequency and a reference phase to the first input of the subtractor 308. The feedback divider 316 provides a feedback signal 328 having a feedback frequency and a feedback phase to the second input of the subtractor 308. The subtractor 308 provides a phase error signal 322 to the input of the loop filter 310 based on a difference between the reference phase of the reference signal 320 and the feedback phase of the feedback signal 328. The loop filter 310 filters the phase error signal 322 and provides a first control signal 324 (e.g., an unmodulated control signal) to the first input of the adder 312. The SSC signal generator 318 provides an SSC signal 330 (e.g., a periodic signal) to the second input of the adder 312. The adder 312 provides a second control signal 326 (e.g., a modulated control signal) to the input of the VCO 314 based on a sum of the first control signal 324 and the SSC signal 330. The VCO 314 provides the switching signal 122 to both the frequency control device output 112a and the input of the feedback divider 316. The feedback divider 316 provides the feedback signal 328 to the subtractor 308 based on a quotient of the switching signal 122 divided by a feedback divisor β (see, for example, Equation 3).

In some examples, the ADC 106 operates according to an oversampling ratio (OSR). The OSR is equal to the quotient of the ADC sampling frequency $f_s$ divided by a Nyquist frequency of the analog signal (e.g., 118 of FIG. 2A). The Nyquist frequency of a signal is equal to twice the highest frequency of that signal. Thus, the Nyquist frequency of the analog signal (e.g., 118) is equal to twice the highest frequency of the analog signal. In some examples, the OSR of the ADC 106 is set to be an even integer value. For example, the ADC sampling frequency $f_s$ may be set based on the highest expected frequency of the analog signal (e.g., 118) so that the OSR is an even integer value. In some examples, the OSR of the ADC 106 may vary (i.e., the ADC 106 may be configured to operate at a plurality of OSRs). In some examples, the OSR of the ADC 106 may vary because the highest expected frequency of the analog signal (e.g., 118) may vary depending on device application. In some other examples, the OSR of the ADC 106 may vary because the ADC sampling frequency $f_s$ may be variable. For example, the ADC may be configured to operate at a plurality of sampling frequencies.

In some examples, the filter 116 is a sinc filter having a length that is equal to the OSR of the ADC 106. In some such examples, the filter 116 may have notches corresponding to filter frequencies in accordance with Equation 1 below:

$$f_{notch} = Z * \frac{f_s}{OSR_{min}} \qquad \text{Eq. 1}$$

where $f_{notch}$ is a substantially attenuated filter frequency of the filter 116 corresponding to a notch of the filter 116, $f_s$ is the ADC sampling frequency, $OSR_{min}$ is the minimum OSR at which the ADC 106 may operate (e.g., the minimum OSR of the plurality of OSRs at which the ADC 106 may operate), and Z is a non-zero integer that is indivisible by $OSR_{min}$.

In some examples, the filter information input 114 provides the filter information 124 to the reference input 306. The reference input 306 provides the reference signal 320 to the subtractor 308 based on the filter information 124. For example, the reference input 306 provides the reference frequency $f_{REF}$ of the reference signal 320 according to Equation 2 below:

$$f_{REF} = \frac{f_s}{M * OSR_{min}} \qquad \text{Eq. 2}$$

where M is an integer and is non-zero, $f_s$ is the ADC sampling frequency, and $OSR_{min}$ is the minimum OSR at which the ADC 106 may operate.

In some examples, the filter information input 114 further provides the filter information 124 to the feedback divider 316. The feedback divider 316 provides the feedback signal 328 based on the filter information 124. For example, the feedback divider 316 provides the feedback frequency $f_{FB}$ and feedback phase $\varphi_{FB}$ of the feedback signal 328 according to Equation 3 below:

$$f_{FB} = \frac{f_{DCDC}}{\beta}; \varphi_{FB} = \frac{\varphi_{DCDC}}{\beta}, \qquad \text{Eq. 3}$$
$$\text{where } \beta = (2k + 1) * M$$

where $f_{DCDC}$ is the frequency of the switching signal 122, $\varphi_{DCDC}$ is the phase of the switching signal 122, M is an integer and k is an integer.

By setting the reference signal 320 and the feedback signal 328 based on Equations 2 and 3, the average discrete converter frequency component (e.g., 122b) of the plurality of discrete converter frequency components of the switching signal 122 will correspond to an odd notch of the filter 116. For example, the average discrete converter frequency $f_{avg}$ will correspond to a frequency according to Equation 4 below:

$$f_{avg} = (2k + 1) * \frac{f_s}{OSR_{min}} \qquad \text{Eq. 4}$$

where k is an integer, $f_s$ is the ADC sampling frequency, and $OSR_{min}$ is the minimum OSR at which the ADC 106 may operate. The other discrete converter frequencies (e.g., 122a, 122c) of the switching signal 122 can then be set to correspond to other frequencies that are spaced from the average discrete converter frequency by the first frequency interval 210. In other words, the other discrete converter frequencies will be offset from the average discrete converter frequency by integer multiples of the first frequency interval 210.

In addition, in some examples, the filter information input 114 further provides the filter information 124 to the SSC signal generator 318. The SSC signal generator 318 provides the SSC signal 330 to the adder 312 based on the filter information 124. For example, the SSC frequency $f_{SSC}$ is set according to Equation 5 below:

$$f_{SSC} = 2N * \frac{f_s}{OSR_{min}} = 2N * M * f_{REF} \qquad \text{Eq. 5}$$

where M is an integer, N is an integer, $f_{REF}$ is the reference frequency of the reference signal 320, $f_s$ is the ADC sampling frequency, and $OSR_{min}$ is the minimum OSR at which the ADC 106 may operate.

Thus, in some examples, the phase-locked loop 302 may set the average discrete converter frequency $f_{avg}$ according to Equation 4 and the other discrete converter frequencies may be added at additional frequencies (e.g., according to the first frequency interval 210) when the first control signal 324 is modulated (e.g., according to the SSC signal 330 having the SSC frequency $f_{SSC}$) at the adder 312.

Although the frequency control device 112 is described as setting the discrete converter frequencies using the phase-locked loop 302, in some other examples, the frequency control device 112 may alternatively set the discrete converter frequencies by a digital direct synthesis system (e.g., implemented using digital circuitry, a processor, or the like) or some other suitable system.

In some examples, the modulator 126 is a delta-sigma modulator or the like. In some examples, the filter 116 is a decimation filter which includes a low pass filter 336 and a decimator 338.

In some examples, the modulator 126 is configured to receive the analog signal 118 from the ADC input 106a. The modulator 126 is configured to convert the analog signal 118 to a modulated signal 128 according to the ADC sampling frequency $f_s$. The filter 116 is configured to filter the modulated signal 128 (e.g., according to the filter response 206) and provide a filtered signal (not shown). In some examples where the filter 116 includes the decimator 338, the decimator 338 is configured to decimate (e.g., down-sample, reduce the sampling rate of, remove samples of, etc.) the filtered signal (not shown) and provide a down-sampled signal as the digital signal 120 at the ADC output 106b. In some examples, the decimator 338 is configured to down-sample the filtered signal according to a decimation rate. In such examples, the decimation rate is set to be proportional or equal to the OSR of the ADC 106.

In some examples, the DC-to-DC converter 104 includes inductors 334 or the like and the ADC include bond wires or the like. In some instances, the coils of the inductors 334 and loops formed by the input bond wires of the ADC 106 experience unintentional electromagnetic coupling. This coupling may enable the EMI (e.g., 110) between the DC-to-DC converter 104 and the ADC 106.

Figure 4:
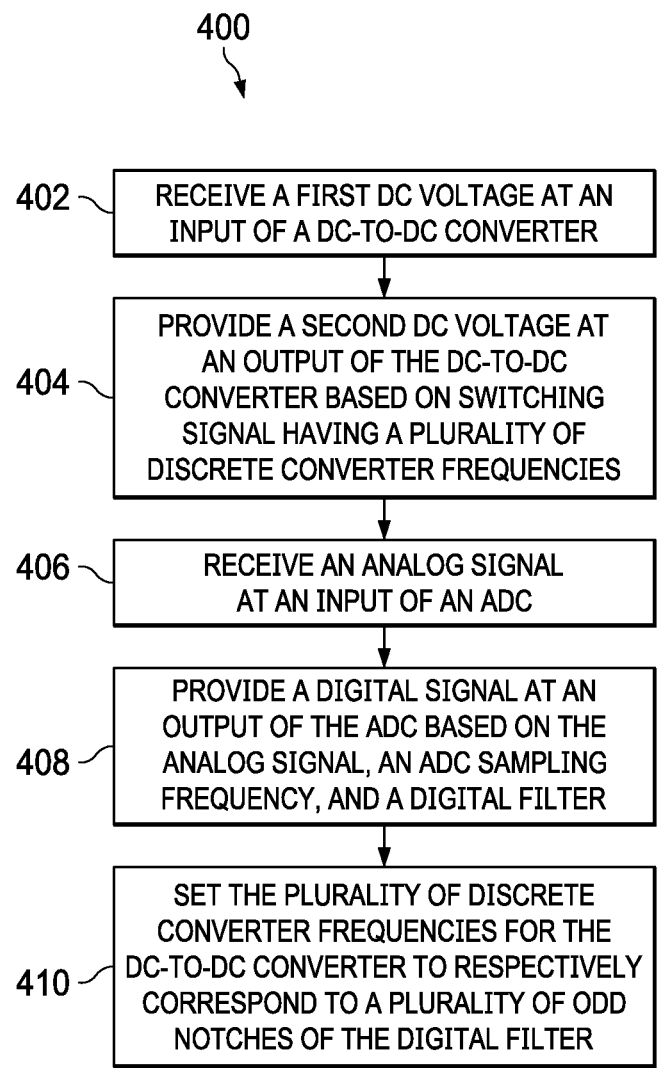
FIG. 4 is an example flow diagram of a method for operating, and reducing an interference between, a DC-to-DC converter and an ADC that is proximate to the DC-to-DC converter.

FIG. 4 is an example flow diagram 400 of a method for operating, and reducing an interference between, a DC-to-DC converter and an ADC that is proximate to the DC-to-DC converter.

At block 402, receive a first DC voltage (e.g., a voltage from a DC power supply, a battery or a rectified AC power supply) at an input of a DC-to-DC converter (e.g., 104).

At block 404, provide a second DC voltage (e.g., a voltage with a magnitude that is the same as or different than the first DC voltage) at an output of the DC-to-DC converter based on switching signal (e.g., 122) having a plurality of discrete converter frequencies. Discrete converter frequencies of the plurality of discrete converter frequencies are spaced apart according to a first frequency interval (e.g., 210; the SSC frequency $f_{SSC}$). For example, the DC-to-DC converter provides a switching signal based on a first discrete converter frequency (e.g., 122a) and a second discrete converter frequency (e.g., 122b) that are spaced apart according to the first frequency interval.

At block 406, receive an analog signal (e.g., 118) at an input (e.g., 106a) of an ADC (e.g., 106).

At block 408, provide a digital signal (e.g., representative of the input signal) at an output (e.g., 106b) of the ADC based on the analog signal, an ADC sampling frequency (e.g., $f_s$), and a digital filter (e.g., 116). For example, the digital signal is provided at the output of the ADC according to a pass band (e.g., 202) and a stop band (e.g., 204) of the digital filter. The digital filter substantially attenuates a plurality of filter frequencies (e.g., a first filter frequency and a second filter frequency) that are in the stop band and that are spaced apart according to a second frequency interval (e.g., 214). The plurality of filter frequencies correspond to a respective plurality of notches (e.g., 216, 218) of the digital filter.

At block 410, set the plurality of discrete converter frequencies for the DC-to-DC converter so that the discrete converter frequencies respectively correspond to a plurality of odd notches (e.g., 216) of the digital filter. For example, set the first discrete converter frequency and the second discrete converter frequency for the DC-to-DC converter so that the first discrete converter frequency and the second discrete converter frequency respectively correspond to a first odd notch and a second odd notch of the digital filter, which correspond to the first filter frequency and the second filter frequency.

As described above, the present description relates to a device including a DC-to-DC converter comprising a frequency control device configured to set a frequency of the DC-to-DC converter based on a digital filter of an ADC that is proximate to the DC-to-DC converter in order to reduce an interference between DC-to-DC converter and the ADC.

The methods are illustrated and described above as a series of acts or events, but the illustrated ordering of such acts or events is not limiting. For example, some acts or events may occur in different orders and/or concurrently with other acts or events apart from those illustrated and/or described herein. Also, some illustrated acts or events are optional to implement one or more aspects or embodiments of this description. Further, one or more of the acts or events depicted herein may be performed in one or more separate acts and/or phases. In some embodiments, the methods described above may be implemented in a computer readable medium using instructions stored in a memory.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero. Modifications are possible in the described examples, and other implementations are possible, within the scope of the claims.

What is claimed is:

1. A device, comprising:
an analog to digital converter (ADC) including:

a modulator; and
a digital filter coupled to the modulator, and configured to substantially attenuate a first filter frequency and a second filter frequency, the second filter frequency is different than the first filter frequency by a second frequency interval; and
a voltage converter coupled to the ADC and configured to operate responsive to a switching signal having a first discrete converter frequency and a second discrete converter frequency, the second discrete converter frequency different than the first discrete converter frequency by a first frequency interval, the voltage converter including:
a frequency control device configured to set the first discrete converter frequency and the second discrete converter frequency so that the first discrete converter frequency is approximately equal to the first filter frequency and the second discrete converter frequency is approximately equal to the second filter frequency.

2. The device of claim 1, wherein the digital filter is configured to substantially attenuate a third filter frequency and a fourth filter frequency that are spaced apart from the first filter frequency and the second filter frequency by integer multiples of the second frequency interval, wherein a first aliased frequency associated with the first discrete converter frequency corresponds to the third filter frequency, and wherein a second aliased frequency associated with the second discrete converter frequency corresponds to the fourth filter frequency.

3. The device of claim 1, wherein the frequency control device is configured to set the first discrete converter frequency and the second discrete converter frequency so that the first frequency interval is equal to an integer multiple of the second frequency interval.

4. The device of claim 1, wherein the first filter frequency and the second filter frequency correspond to a first filter notch and a second filter notch.

5. The device of claim 4, wherein a third filter notch is between the first filter notch and the second filter notch.

6. The device of claim 4, wherein the first filter notch and the second filter notch are odd numbered filter notches when counting consecutive filter notches outwardly from a pass band of the filter.

7. The device of claim 1, wherein the digital filter is configured to attenuate the first filter frequency and the second filter frequency by a magnitude of 10 or more.

8. The device of claim 1, wherein the first frequency interval corresponds to a spread spectrum clocking (SSC) frequency of the voltage converter.

9. The device of claim 1, wherein the frequency control device includes a phase-locked loop or a frequency-locked loop, and wherein the frequency control device includes a spread-spectrum clocking signal generator.

10. A system, comprising:
an analog to digital converter (ADC) coupled to the DC-to-DC converter and including:
a modulator configured to convert an analog signal to a modulated signal based on an ADC sampling frequency; and
a digital filter configured to convert the modulated signal to a digital signal according to a pass band and a stop band, wherein the digital filter has a plurality of notches in the stop band corresponding to a plurality of filter frequencies that are substantially attenuated by the digital filter, and wherein the filter frequencies are based on the ADC sampling frequency and an oversampling ratio of the ADC; and
a direct current to direct current (DC-to-DC) converter coupled to the ADC, and configured to operate responsive to a switching signal having a plurality of discrete converter frequencies that are different from one another by a first frequency interval, the DC-DC converter including:
a frequency control device configured to set a first discrete converter frequency of the plurality of discrete converter frequencies and the first frequency interval based on the ADC sampling frequency and the oversampling ratio of the ADC so that each of the plurality of discrete converter frequencies are approximately equal to filter frequencies of the plurality of filter frequencies.

11. The system of claim 10, wherein the notches of the digital filter are spaced apart by a second frequency interval that is equal to the first frequency interval, and wherein the notches are odd numbered notches of the digital filter.

12. The system of claim 10, wherein oversampling ratio is equal to a quotient of the ADC sampling frequency and to a Nyquist frequency of the analog signal, wherein the Nyquist frequency of the analog signal is equal to twice a highest frequency of the analog signal.

13. The system of claim 10, wherein the digital filter is configured to reduce a sample rate of the digital signal based on a decimation rate that is proportional to the oversampling ratio.

14. The system of claim 10, wherein the frequency control device is configured to set the first discrete converter frequency based on a reference frequency and a feedback divisor of the frequency control device, wherein the frequency control device is configured to set the first frequency interval according to a periodic signal of the frequency control device, and wherein the reference frequency, the feedback divisor, and the periodic signal are each set at the frequency control device based on the ADC sampling frequency and the oversampling ratio.

15. The system of claim 10, wherein the ADC is configured to operate at a plurality of oversampling ratios.

16. The system of claim 15, wherein the frequency control device is configured to set the first discrete converter frequency and the first frequency interval based on a minimum oversampling ratio of the plurality of oversampling ratios.

17. A method, comprising:
receiving a first direct current (DC) voltage at an input of a direct current to direct current (DC-to-DC) converter;
providing a second DC voltage at an output of the DC-to-DC converter based on a switching signal having a plurality of discrete converter frequencies that are different from one another by a first frequency difference;
setting a first discrete converter frequency and a second discrete converter frequency of the plurality of discrete converter frequencies for the DC-to-DC converter so that the first discrete converter frequency and the second discrete converter frequency respectively correspond to a first discrete filter frequency and a second discrete filter frequency of the a plurality of discrete filter frequencies attenuated by digital filtering of an analog-to-digital converter (ADC), the plurality of discrete filter frequencies differing from one another by a second frequency difference.

18. The method of claim 17, wherein the first discrete filter frequency and the second discrete filter frequency correspond to notches of the digital filtering.

19. The method of claim 17, wherein setting the first discrete converter frequency and the second discrete converter frequency comprises setting the first frequency difference to correspond to an integer multiple of the second frequency difference.

20. The method of claim 17, wherein the first discrete converter frequency and the second discrete converter frequency are set based on an ADC sampling frequency and an oversampling ratio of the ADC.

* * * * *